(12) United States Patent
Settepani

(10) Patent No.: US 7,331,265 B2
(45) Date of Patent: Feb. 19, 2008

(54) ELECTROMAGNETIC PUNCH PRESSES WITH FEEDBACK DEVICE

(75) Inventor: Philip W. Settepani, Selden, NY (US)

(73) Assignee: Winset Technologies L.L.C., Islandia, NY (US)

( * ) Notice: Subject to any disclaimer, the term of this patent is extended or adjusted under 35 U.S.C. 154(b) by 63 days.

(21) Appl. No.: 11/085,610

(22) Filed: Mar. 21, 2005

(65) Prior Publication Data

US 2005/0210951 A1   Sep. 29, 2005

Related U.S. Application Data

(60) Provisional application No. 60/554,565, filed on Mar. 19, 2004.

(51) Int. Cl.
   *B26D 5/08* (2006.01)
(52) U.S. Cl. .......................................... 83/575; 83/530
(58) Field of Classification Search .......... 83/575–577, 83/529, 530, 74, 75; 100/49
   See application file for complete search history.

(56) References Cited

U.S. PATENT DOCUMENTS

| | | | | |
|---|---|---|---|---|
| 4,599,007 A | * | 7/1986 | Khorsand | 400/322 |
| 4,743,821 A | * | 5/1988 | Hall | 318/599 |
| 5,113,736 A | * | 5/1992 | Meyerle | 83/575 |
| 5,222,012 A | * | 6/1993 | Frankeny et al. | 361/156 |
| 5,905,352 A | * | 5/1999 | Carbaugh et al. | 318/611 |
| 6,305,258 B1 | * | 10/2001 | Henderson et al. | 83/13 |
| 6,484,613 B1 | * | 11/2002 | Lee et al. | 83/13 |
| 6,695,102 B1 | * | 2/2004 | Marjoram et al. | 188/267.2 |

* cited by examiner

*Primary Examiner*—Stephen Choi
(74) *Attorney, Agent, or Firm*—Thomas A. O'Rourke; Bodner & O'Rourke, LLP

(57) ABSTRACT

An electromagnetically driven punch press is described. The punch press has an engine plate and a die set and a ram between the engine plate and die set. The engine plate has an assembly fixed thereto having a solenoid with windings that create a magnetic field when a current is applied. The engine plate has a feedback means positioned on the engine plate to provide real-time data on the position and velocity of the ram with respect to said engine plate.

10 Claims, 6 Drawing Sheets they cannot be performed in real-time while the press is
ELECTROMAGNETIC PUNCH PRESSES WITH FEEDBACK DEVICE This is a conversion of U.S. Provisional Patent Application Ser. No. 60/554,565, filed Mar. 19, 2005, the disclosures of which are incorporated herein by reference.

FIELD OF THE INVENTION

The present invention is in the field of electromagnetically driven punch presses, and more particularly relates to such presses having a feedback device for velocity and positioning of the press tool to relay positional and impact velocity information of the press upon a piece of work to a controller for adjustment or regulation.

BACKGROUND OF THE INVENTION

Conventional press systems use flywheels, hydraulics or pneumatics to slowly push or force tools through a material, or work. These methods often cause distortion, burrs, inconsistent quality due to their slow velocity pressing. These systems cannot achieve a high impact velocity because of their drive systems. Hence, these slow moving presses usually require lubricants, frequent maintenance and tool replacement or sharpening.

Typical punching operations undergo three phases: elastic, plastic and fracture. In the elastic phase, the work stretches around the tool being pressed into it. The slower the punch moves, the more the work will stretch. The elasticity of the materials is particularly noticeable when punching work that is plastic or rubber, in that these materials will deform around the tool being pressed into them.

In the plastic phase, the work will begin to form small sections, or strings. These strings will be the only portion of the work still connecting the punched portion, or finished pieces, to the non-punched portion, or scrap pieces. Again, this phase is particularly problematic when punching rubber or plastic work materials.

When the strings begin to tear from the finished piece, the fracture phase has begun. As the punch pushes further through the work, each string will rupture, eventually resulting in a freed finished piece. However, the relatively slow impact velocity resultant when using a press with a flywheel, hydraulic or pneumatic drive system can cause significant problems with the finished piece.

A significant problem with mechanical presses is the overall size of the punch press machine. Manufacturers may find it difficult to orient the supplemental equipment that is typically associated with pressing functions, such as a hanging roll feed and/or straightener. Additionally, the tooling used in a mechanical press cannot be removed easily. Hence, when the tool must be replaced or sharpened, a significant delay is interposed in the pressing operation. When the press operations are moving at 20 strokes (presses) per minute, any lengthy delay can become quite costly.

Another problem associated with mechanical presses is the creation of burrs on the finished piece. During the plastic phase, the finished piece is still connected to the scrap piece by strings. When these strings rupture, a small amount of the string, or burr, is left on the edge of the finished piece. A significant amount of burrs can result in malformed finished pieces, which may need to be smoothed, or discarded. Burrs can be significantly problematic when punching plastic and/or rubber work materials, as these materials have high elasticities. One problem associated with burr creation is rolled edges. Due to the heat generated over a relatively long amount of time because of slow impact velocity, the edges of the finished piece may be rolled upwardly around the edge of the tool performing the press.

Tool life and sharpening are also factors that are considered in punch press operations. With mechanical punches performing around 20 strokes per minute, the tool, or dieset, will begin to lose its sharp edges. A misshapen tool can result in increased burrs and particulates, and may lead to disposal of an unsatisfactorily finished piece. When this occurs, the manufacturer must not only discard the substandard finished pieces, it must stop the pressing process and replace or sharpen the tool. Due to a slow dwell time (time between presses) inherent with mechanical presses, any stoppage in the pressing process can be exceedingly costly.

Punch presses can be used in the manufacturing process for integrated circuits. In this manner, the punch press may be used to punch the PC boards used for the integrated circuits. Alternatively, the presses may be used to stamp flexible, plastic separators used in green ceramic processing. The stamping usually occurs in s clear room, and thus, it is extremely important that the process produce no particulates or burrs.

With the above-mentioned disadvantages in mind, electromagnetically driven punch presses have been developed. An electromagnetic drive system can significantly increase the impact velocity from the prior mechanical presses. An increased velocity of the tool can overcome the disadvantages of the mechanical presses, primarily by effectively eliminating the time the work spends in the elastic and plastic phases. Without expending time in these phases, the press takes the work directly to the point of fracture, eliminating burrs, rolling, and other problems associated with slow, mechanical presses. However, with decreased dwell time, electromagnetic presses can operate between 20 and 400 strokes per minute. At this rate, heat can build up and cause the resistance, exemplified by the solenoid, to increase. If the current to the solenoid is not increased, the press will operate slower, embodied in slower dwell time and/or slower impact velocity. In either situation, work material may be wasted, or the press may have to be cooled, which can present a significant delay.

One such electromagnetic press is described in U.S. Pat. No. 5,113,736 to Meyerle. Meyerle '736 teaches a punch press electromagnetically driven by a solenoid winding. When energized, the solenoid winding pulls an armature through the winding space. The armature presses a tool into a piece of work material, and completes the punch. The armature's impact is absorbed by a series of urethane stoppers, and is returned to its start position by a series of springs, which are connected to the tool. The press taught by Meyerle '736 contains several methods for manually adjusting the stroke length of the tool, due to work material thickness, tool height reduction due to sharpening, and various other reasons. These adjustments are static, in that they cannot be performed in real-time while the press is operating. The current to the solenoid must be discontinued, and the adjustments must be made to several portions of the press before re-starting the press. It can be undesirable to be unaware of the real-time functional conditions of the press while it is operating. For example, if the press velocity begins to slow, the same problems that are inherent in mechanical presses may begin to arise. Hence, a device used to provide real-time updates to conditions such as velocity and dynamic positioning of the press can provide useful advantages.

Another electromagnetic press is described in U.S. Pat. No. 6,484,613 B1 to Lee et al. Lee '613 teaches a press that applies a current to a solenoid to force an armature into a piece of work material. However, to restrain the recoil effect of the armature, a second current is applied to break the armature. While breaking the armature may be advantageous is limiting the recoil effect, this method does not compensate for any real-time updates of the press's operating conditions. Hence, an operator or manufacturer may only have the capability to turn the press on; however, if the press should begin to slow and cause malformed finished pieces, the operator will not be notified of such an event until after the pieces have been formed, which is costly and wasteful.

There presents a need for a device which can provide the operator/manufacturer with important information regarding impact velocity, dwell time and tool positioning, while the press is operating.

OBJECTS OF THE INVENTION

It is an object of the present invention to provide a feedback device for an electromagnetic punch press which can deliver information to the operator/manufacturer regarding velocity and/or positioning of the press during its operation.

It is an object of the present invention to provide a feedback device for an electromagnetic punch press which can provide real-time operational data regarding the press including the operation of the press.

It is an object of the present invention to provide a feedback device for an electromagnetic punch press which can provide information for maintaining uniformly punched work pieces.

It is an object of the present invention to provide a feedback device for an electromagnetic punch press to allow the punch press to maintain a consistent impact velocity.

It is an object of the present invention to provide a feedback device for an electromagnetic punch press to provide a means for allowing heat on the solenoid to dissipate between punches.

It is an object of the present invention to provide a feedback device for an electromagnetic punch press to allow the solenoid to receive continuous current while the press is operational.

It is an object of the present invention to provide a feedback device for an electromagnetic punch press to provide consistent, burr-free cuts.

It is an object of the present invention to provide a feedback device for an electromagnetic punch press to reduce the "rolled edge" effect on the work material.

It is an object of the present invention to provide a feedback device for an electromagnetic punch press which does not need any lubricant, and hence can be used in clean rooms.

It is an object of the present invention to provide a feedback device for an electromagnetic punch press which produce reduced amounts of particulates when punching, and hence can be used in clean rooms.

SUMMARY OF THE INVENTION

The present invention is directed to an electromagnetically driven punch press, which can incorporate a feedback device for measuring velocity and position of the press while it is operating. The feedback device may be an encoder, a linear transducer, potentiometer, an optical switch or other instrument to measure velocity and dynamic positioning.

In one embodiment, the electromagnetic punch press comprises a solenoid winding and vertically moving armature arranged in a housing on an engine plate. When energized by current application, the solenoid moves the armature vertically through its windings and displaces a ram, or tool, downward onto a piece of work material. The ram can be guided by a series of guide pins with stop bushings, which can absorb some of the impact force of the ram, while sending the ram upward to its start position, along the same axis. The ram can also have at least one spring attached to it. The spring will be compressed past its rest position when the ram is moved downward. When the ram is no longer forced downward by the armature (i.e. no current to the windings of the solenoid), the springs will recoil and pull the ram back to its start position.

The press may have several adjustment mechanisms that the operator can manipulate to compensate for thicker work materials, the amount of force needed to punch, the recoil effect, speed of work material going through the press and other operational aspects of the press. Additionally, the press may have a pole piece fitted between the members of the armature. The pole piece can be a ferromagnetic material, with a portion of it inserted into the space between the windings of the solenoid. When the solenoid is energized, the pole piece can provide added force with which to pull the armature downward.

In this embodiment, a feedback device may preferably be attached to the stationary engine plate at one end and the ram at the other end or in any other suitable location. The feedback device may be an encoder, a potentiometer, a linear transducer, optical switch or other instrument that will be able to measure the velocity of the ram, both on downward motion and recoil. The feedback device can also preferably be adapted to measure velocity of the ram at any given time during the press's operation, as well, if desired, as providing positional information of the ram. The feedback device can be electronically or remotely connected to a controller, which can, in a preferred embodiment, measure the operational data of the press in real-time. The operational data can include, but is not limited to velocity of the ram, impact force of the ram, current being applied, heat generated by the electromagnetic motor, positional data of the ram, punch rate, and other aspects of the press.

The controller can comprise a processor and an amplifier. The amplifier can modulate the AC signal from the controller into a DC current, which is applied to run the motor. In this manner, the encoder can measure the velocity and be used to temper the amount of current applied to the motor. Hence, the velocity of the motor can be adjusted as heat is generated or dissipated based on use.

DETAILED DESCRIPTION OF THE DRAWINGS

Figure 1:
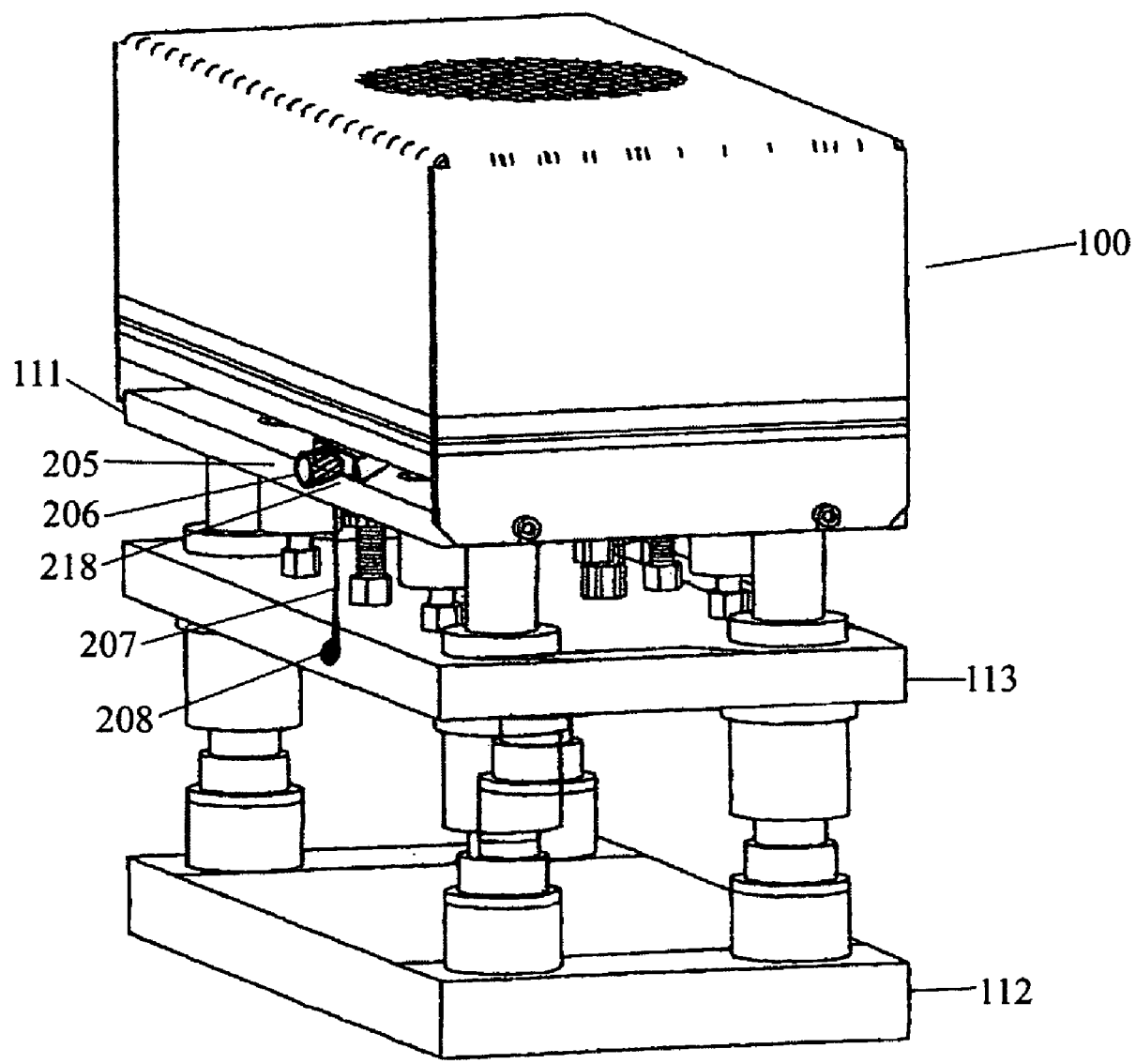
FIG. 1 is a perspective view of an electromagnetically driven punch press with the feedback device of the present invention installed on it.

As seen in FIG. 1, the electromagnetically driven punch press is shown generally at 100. A typical press 100 can be generally described as having two tiers, an engine plate 111 and a die set 112, which are both preferably stationary with respect to the press itself. However, the die set 112 may be equipped with a series of wheels or treads that will allow it to be mobile. Between the engine plate 111 and die set 112 can be a ram, or tool 113. The ram is generally the functional portion of the press, as it is performing the impact (punching, pressing, stamping) on the work material being passed through the press.

An assembly fixed to engine plate 111 has a solenoid with windings that create a magnetic field when current is applied. At that moment, the magnetic field generated forces an armature through the windings and creates the punching effect with the ram 113, which acts on a piece of work material. However, as the magnetic press performs hundreds of strokes per hour, the solenoid will begin to generate heat. As the solenoid gets hotter, its measured resistance increases and would require an increased current to continue punching at the same velocity and time interval. However, this aspect has not been contemplated by the prior art. Hence, as heat is generated the press velocity decreases and dwell time increases, which can present the same problems that are associated with mechanical presses.

To overcome the problems associated with increased heat generation by the solenoid, a feedback device 205 can be positioned on the engine plate. In a preferred embodiment, the feedback device is a digital encoder. Preferably, the digital encoder can provide real-time data for positioning and velocity of the press. In another embodiment, the feedback device may be a linear transducer. Examples of linear transducers are string pots, draw wire sensors, string encoders or yo-yo sensors. In a further embodiment, the feedback device may be a digital or mechanical linear potentiometer or an optical switch.

With respect to FIG. 1, the feedback device 205 can be a digital encoder. The encoder 205 can have a retractable cable 207 attached to a reel 206 at one end, and a bolt 208 at its other end. The reel 206 is preferably spring-loaded to be able to retract the cable. The bolt 208 can be fixed to the ram 209, and the reel 206 can be rotatably mounted within a housing 218 on the engine plate. Similarly, the bolt 208 can be fixed to the on the engine plate, and the reel 206 can be rotatably mounted within a housing 218 on the ram 209.

In operation, a current will be applied to the solenoid, which will create a magnetic field around its windings. The magnetic field will pull an armature through the windings will a great deal of force to create the punch effect. As the ram 209 moves vertically, the cable 207 can measure the ram's vertical movement. With this positioning data, the velocity of the ram can easily be calculated based on the amount of time taken and relayed to the operator of the press. Real-time velocity data can allow the control and/or the operator to monitor the functioning of the press, preventing inconsistent punches or slow-velocity impacts, which can result in wasted work material. The same data can be obtained using a linear transducer, a potentiometer, optical switch or any other device equipped to provide positional data from which velocity and other vector quantities can be extrapolated. For example, a optical switch may be used to measure when the bottom of the stroke of the ram is reached. The optical switch may be mounted on the engine plate and there may be a flag or other suitable means on the ram. An infrared beam or other form of light can be used to measure when the travel of the ram on the downward stroke is completed. Suitable arrangements for measuring when the downward stroke of the ram is completed can be made using a linear transducer, a potentiometer or other suitable device. With the positioning data, the velocity of the ram can easily be calculated based on the amount of time taken to reach the limit of travel and relayed to the operator of the press.

Figure 2:
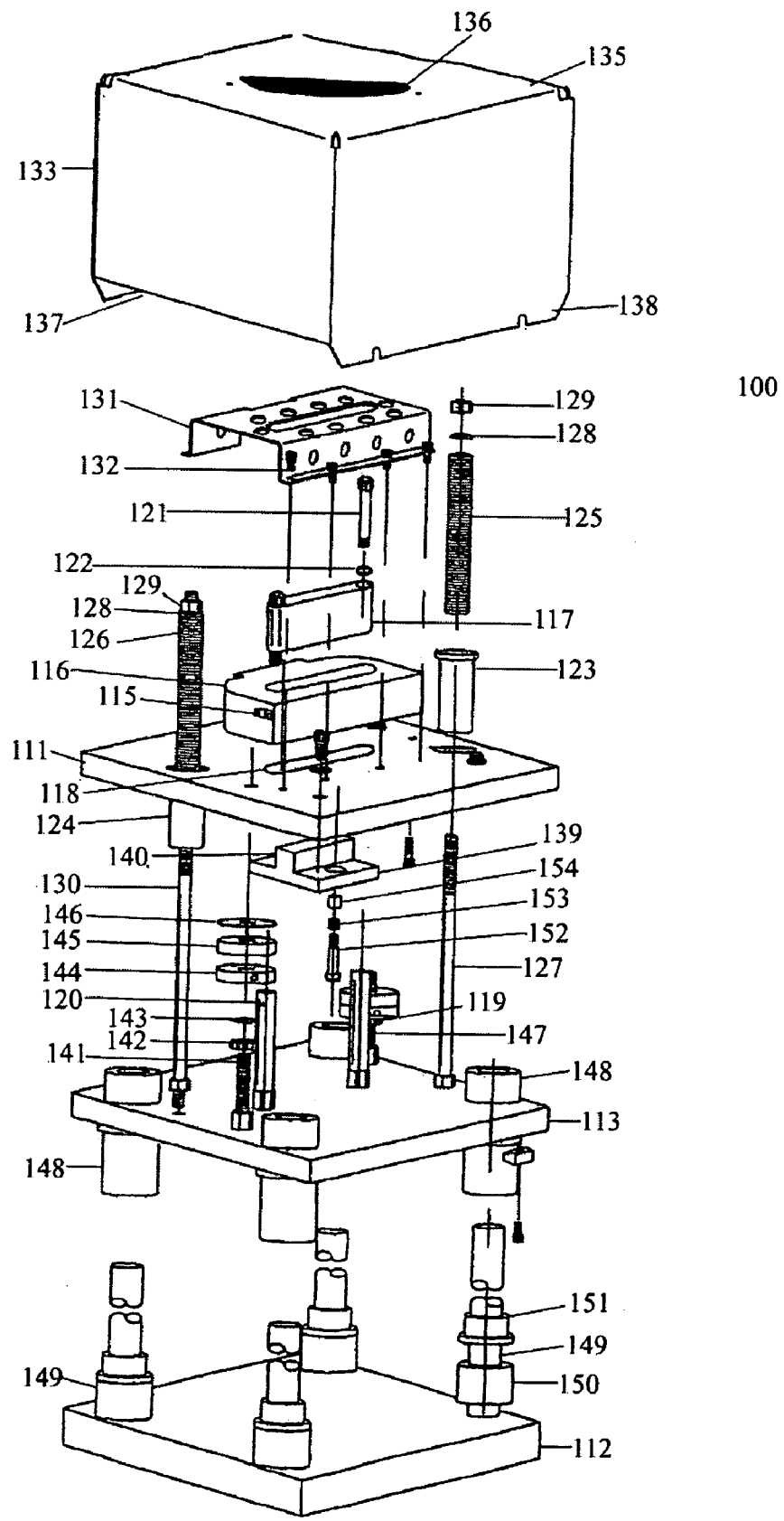
FIG. 2 is an exploded view of an electromagnetically driven punch press used in conjunction with the present invention.

FIG. 2 shows the electromechanical function of the punch press in more detail. In FIG. 2, the electromagnetically driven punch press is show generally at 100. The press 100 can be generally described as having two tiers, an engine plate 111 and a die set 112, which are both preferably stationary with respect to the press itself. However, the die set 112 may be equipped with a series of wheels or treads that will allow it to be mobile. Between the engine plate 111 and die set 112 can be a ram, or tool 113. The ram is the functional portion of the press, as it is performing the impact (punching, pressing, stamping) on the work material being passed through the press.

Attached to a top surface 114 of engine plate 111, can be an assembly 115. The assembly 115 can comprise a molded coil 116, which can take the form of a solenoid winding. Hence, when current is applied to the coil 116, a strong magnetic field is generated. An armature 117 may pass through the center of the molded coil 116. The armature 117 may also pass through a hole 118 in engine plate 111. Hole 118 should preferably allow for vertical movement of the armature 117 through the molded coil 116. The armature 117 can have a first support 119 and a second support 120, which attach to it by a suitable means such as screw 121 and washer 122 combinations. At the end the end of each support opposite the armature 117, each support can attach to the ram 113. The attachments of the supports to the ram are preferably immovable to maintain strict measured vertical movement of the ram. Enclosing the assembly 115 and attaching to the engine plate 111 can be a coil plate 131. The coil plate 131 can preferably be manufactured from a ferromagnetic material to enhance the magnetic flux generated by the solenoid windings. The coil plate 131 can be attached to engine plate 111 by mechanical means, such as screws 132.

Embedded within the engine plate 111 can be a first spring cup 123 and a second spring cup 124. First spring cup 123 can receive a first return spring 125, and second spring cup 124 can receive a second return spring 126. A first spring support 127 can attach at one end to ram 113, move vertically through first spring cup 123 and first return spring 125, and be stopped at a second end by, for example, a washer 128 and lock nut 129 combination. A second spring support 130 can attach at one end to ram 113, move vertically through second spring cup 124 and second return spring 126, and be stopped at a second end by, for example, a washer 128 and lock nut 129 combination. The lock nuts 129 can be adjusted on the spring supports in such a manner to increase or reduce the compression of the return springs. For example, moving the lock nut further downward along the spring support will decrease the ram's range of motion, or may allow for a smaller shut height starting position.

Encapsulating the assembly 115 on engine plate 111 can be a fan cover assembly 133. The fan cover assembly 133 can have a box-like structure with a series of sidewalls 134. A top wall 135 of the fan cover assembly may have an opening to allow for fitting of an exhaust fan 136. The exhaust fan can be a very important factor in dissipating heat caused by the application of current to the press, as overheating can cause stoppages and damage to the press. A pair of sidewalls can be equipped with vent portions 137, which will also facilitate dissipation of heat. A second pair of sidewalls can be equipped with attachment means 138 that will allow the fan cover assembly to be fixed to the engine plate 111.

The dynamic portion of the press 100 is the ram 113. The downward vertical acceleration of the ram 113 is assisted by the addition of a pole piece 139. The pole piece 139 can be T-shaped and have an inverted orientation, such that its base portion 140 resides within the space created by the solenoid windings. The pole piece 139 can attach to the engine plate by a screw socket 152, spring 153 and bearing 154. The spring 153 and bearing 154 can allow the pole piece 139 to absorb some of the shock of the armature 117 and return to its original position without a great deal of noise or vibration. Preferably the pole piece 139 has ferromagnetic characteristics that can boost the available energy and magnetic force with which to pull the armature through the windings. As an inverted T, the pole piece 139 can act as a shock absorber, while reducing noise and vibration upon being struck by the vertically moving armature. In addition, a first return stop rod 141 can be attached to, and extend vertically upward from ram 113. The return stop 141 can be fitted with a knurl nut 142, a washer 143, a return stop disc 144, a return bumper 145 and an isolator disc 146. This combination of elements can further absorb the shock of the armature, while aiding in reducing noise and vibration. A second return stop 147 can be provided on ram 113 and have a symmetrical grouping of elements. After the armature has completed its work stroke and begins its recoil, the return stops can cushion and reduce harmful effects that might occur if the ram's recoil was not hindered by any mechanism.

Each corner of the ram 113 preferably has a guide housing 148. Each guide housing 148 is preferably a hollow, cylindrical cup, which is adapted to receive guide posts 149 positioned along similar axes on the die set 112. Each guide post 149 is preferably fitted with a stop bushing 150 and a busing retainer adjustor 151. The stop bushing 150 can be a cylindrical shell that fits around the guide post 149, and is manufactured from a substance, such as urethane, that can adequately absorb the impact of the ram 113 at the end of its work stroke.

Figure 3:
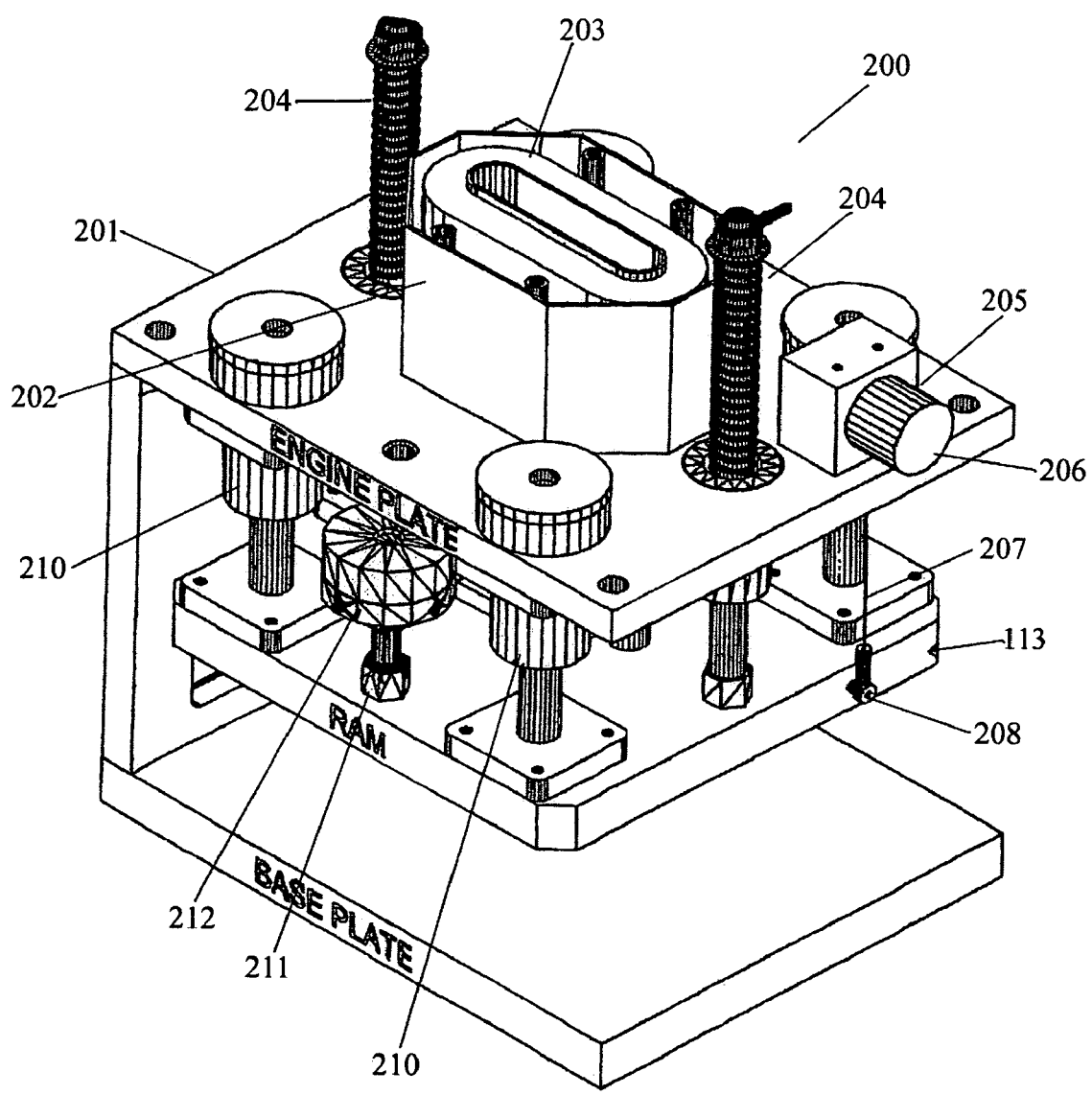
FIG. 3 is a perspective view of a second embodiment of an electromagnetically driven punch press with a feedback device installed on it.

FIG. 3 depicts a second embodiment 200 of an electromagnetically driven punch press with a feedback device positioned on it. In this embodiment, the engine plate 201 has a linear motor 202 positioned on it. The linear motor is preferably a DC motor composed of a solenoid with a series of windings 203. The engine plate 201 has entrances for return springs 204, similar to those described with respect to the first embodiment. The feedback device, or encoder, 205 is seen as fixed to the engine plate 201. In this embodiment, the encoder 205 has a spring-loaded reel, or spool, 206 with a cable 207 attached to it at one end. At the other end of cable 207 is a bolt 208, which is preferably fixed to the ram 113. In this embodiment, as in the embodiment previously described, the encoder can measure positional data and extrapolate velocity information, displaying both in real-time to an operator or user.

Also in the embodiment of FIG. 3, the ram 113 has self-aligning bearings 210 and a stroke adjustor 211 with return stops 212. The use of self-aligning bearings limits the manufacturing costs associated with the guide housing and guide posts depicted in the first embodiment. Additionally, self-aligning bearings have two rows of balls and a common concave sphered raceway in the outer ring. Hence, the bearings are self-aligning and insensitive to angular misalignments of the shaft relative to the housing. They are therefore particularly suitable for applications where considerable shaft bending or errors of alignment are to be expected. High-speed performance and an unparalleled speed range are produced as a result of having the lowest start up and operational friction of any rotary bearing. Due to the low friction and reduced maintenance requirements, relubrication intervals are lengthened, which keeps the bearing running efficiently. Extensive, comparative tests have shown that SKF self-aligning ball bearings have the lowest vibration and noise levels currently available, as a result of their accurate and smooth raceways.

The stroke adjustor 211 can be raised or lowered to control the distance the ram 113 will travel during its works stroke and recoil. Also, the return stops 212 are preferably manufactured of a substance which can adequately absorb shock while limiting noise and vibration during the movement of the ram 113.

Figure 4:
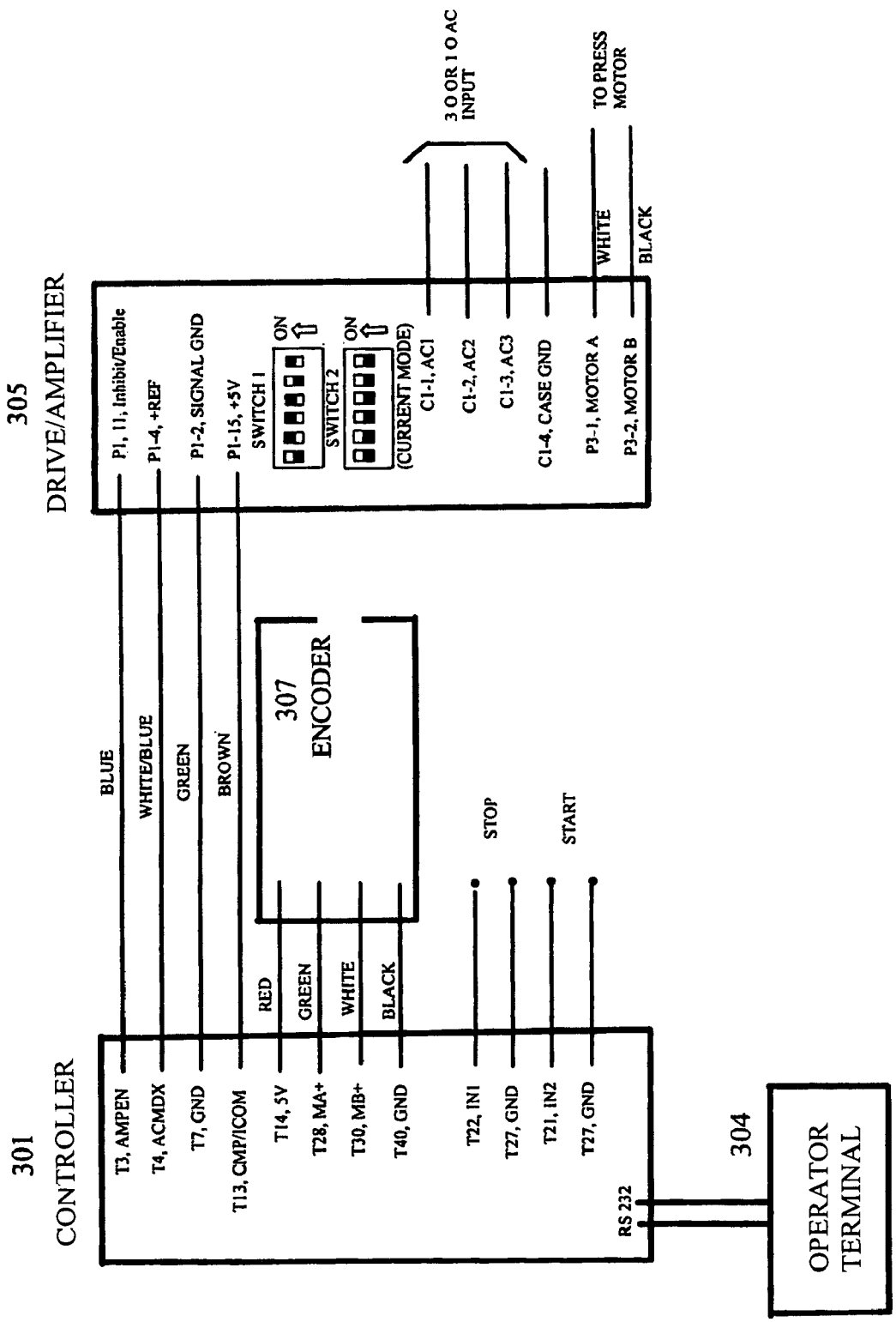
FIG. 4 is a circuit schematic of the feedback device, controller, amplifier and user terminal for use on an electromagnetically driven punch press as described by the present invention.

A controller schematic is shown generally at 300 in FIG. 4. The controller 301 has a dual input 302 for stopping and starting the press. The controller 301 can communicate with the feedback device 303, which may be an encoder. The encoder 303 can transmit positional and velocity data obtained from movement of the cable that is fixed to the ram. The controller 301 can be connected to a user or operator terminal 304, which can display data from the encoder in a real-time fashion. The operator terminal 304 may be adapted to display the encoder data and extrapolate various other informative quantities from it.

Figure 5:
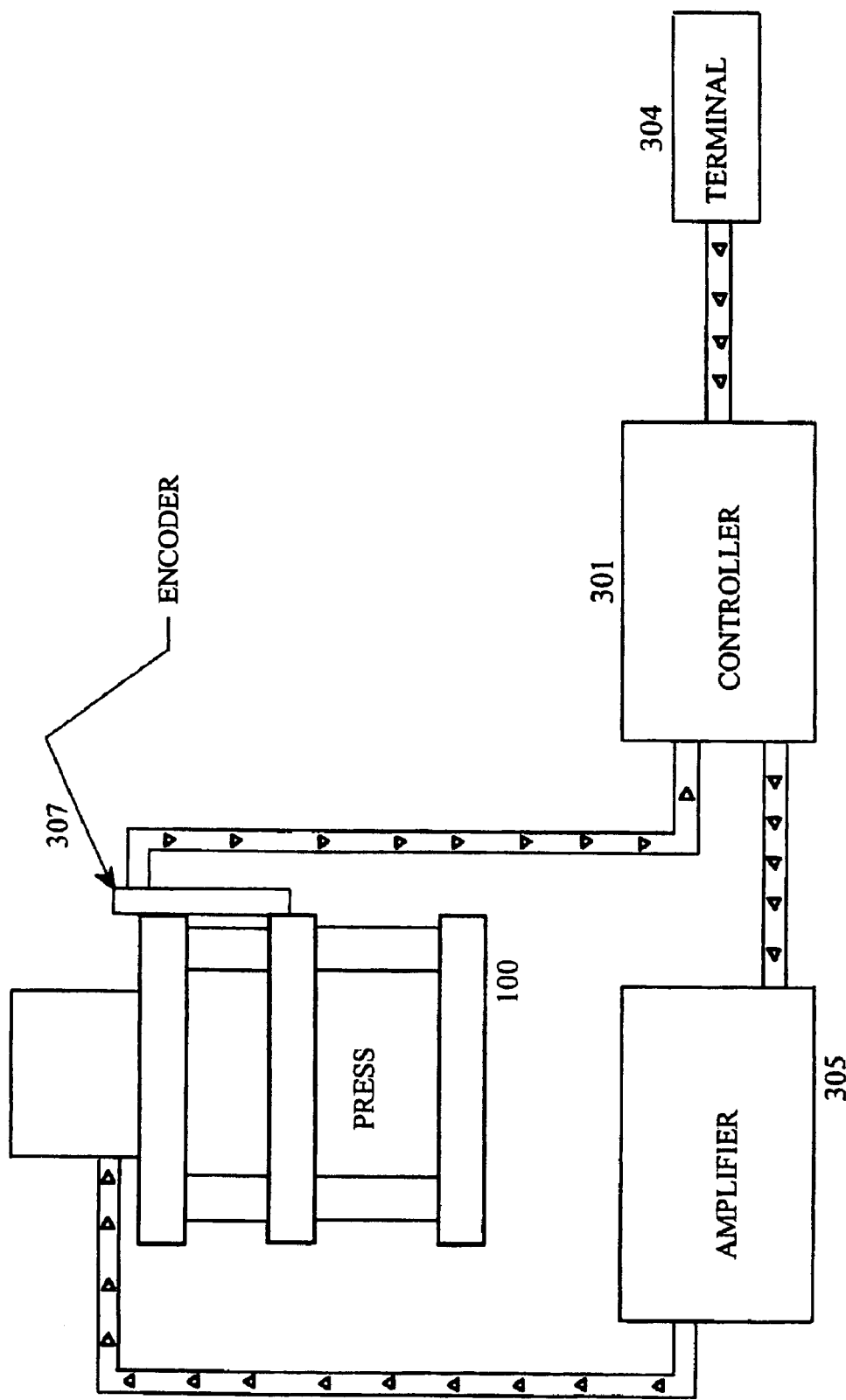
FIG. 5 is a circuit schematic showing the feedback device as a encoder, press, controller, amplifier and user terminal for use on an electromagnetically driven punch press as described by the present invention.

The controller 301 also is in communication with an amplifier 305. The amplifier can process, amplify and rectify an inputted AC line voltage to a DC line, which can be transmitted to the DC motor at 306. A schematic of the system is shown in FIG. 5, this figure illustrates the further embodiment displaying a feedback device of an encoder 307. The controller 301 is connected to the user or operator 304. The controller 301 is in communication with an amplifier 305. The amplifier 305 transmits the information from the controller 301 to the press 100 and the encoder 307 is a feedback device that sends information back to the controller 301.

Figure 6:
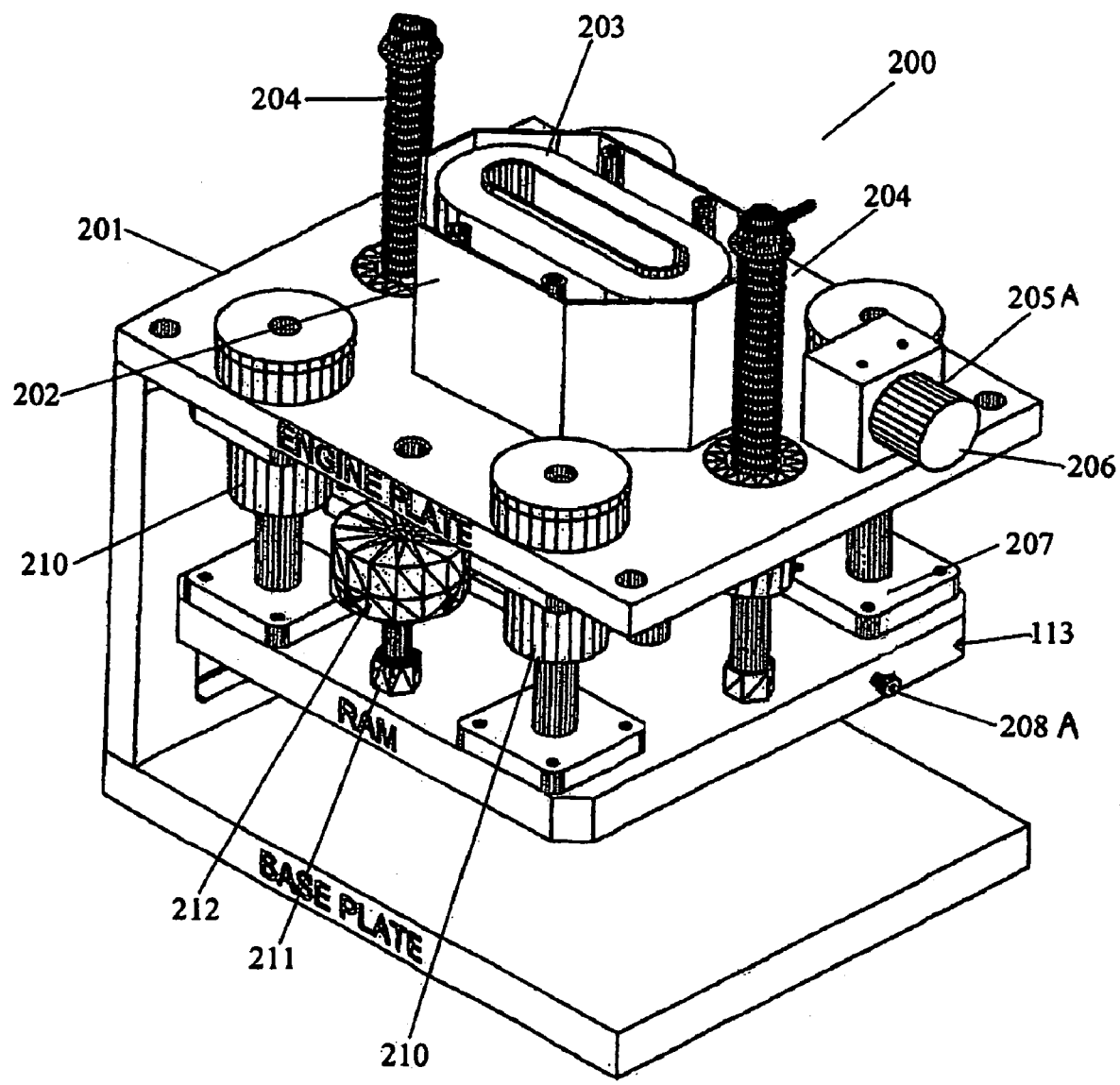
FIG. 6 is a different embodiment of an electromaanetically driven punch press with a feed back device positioned on it.

FIG. 6 depicts a third embodiment 200 of an electromagnetically driven punch press with a feedback device positioned on it. In this embodiment, the engine plate 201 has a linear motor 202 positioned on it. The linear motor is preferably a DC motor composed of a solenoid with a series of windings 203. The engine plate 201 has entrances for return springs 204, similar to those described with respect to the first embodiment. The optical switch 205A is seen as fixed to the engine plate 201. In this embodiment, there is a flag 208A fixed to the ram 113. In this embodiment, the optical switch can measure positional data and extrapolate velocity information, displaying both in real-time to an operator or user.

We claim:

1. An electromagnetically driven punch press comprising an engine plate and a die set and a ram between the engine plate and die set, said engine plate having an assembly fixed thereto having a solenoid with windings that create a magnetic field when a current is applied, said magnetic field forcing an armature through the windings causing said ram to move towards said die set, said engine plate having a feedback means positioned on said engine plate and a signal means on said ram, said feedback means being adapted to measure the distance and direction of travel of said signal means thereby providing real-time data on the position and velocity of the ram with respect to said engine plate; said feedback means being connected to a controller, said controller comprising a processor and an amplifier, and wherein said feedback means measures the velocity of said ram and adjusts the amount of current applied to said solenoid, to thereby adjust the velocity of the ram.

2. The press according to claim 1 wherein said solenoid generates heat during continuous operation of the ram, and current to the solenoid is increased to continue to permit the ram to punch at a set velocity and time interval.

3. The punch press according to claim 2 wherein the feedback means includes an optical switch and said signal means is a flag.

4. The punch press according to claim 2 wherein said feedback means is a linear transducer.

5. The punch press according to claim 4 wherein said linear transducer is a string pot.

6. The punch press according to claim 4 wherein said linear transducer is a draw wire sensors.

7. The punch press according to claim 4 wherein said linear transducer is a string encoder.

8. The punch press according to claim 4 wherein said linear transducer is a yo-yo sensors.

9. The punch press according to claim 2 wherein said feedback means is a linear potentiometer.

10. The punch press according to claim 2 wherein the feedback means is a digital encoder.

* * * * *